(12) United States Patent
Driemeyer-Franco et al.

(10) Patent No.: US 10,048,319 B2
(45) Date of Patent: Aug. 14, 2018

(54) ESTIMATING OF THE STATE OF CHARGE OF A BATTERY

(71) Applicant: RENAULT s.a.s., Boulogne-billancourt (FR)

(72) Inventors: Ana-Lucia Driemeyer-Franco, Montigny-le-bretonneux (FR); Laurent Gagneur, Montigny-le-bretonneux (FR); Marc Lucea, Boulogne-billancourt (FR)

(73) Assignee: RENAULT s.a.s., Boulogne-billancourt (FR)

( * ) Notice: Subject to any disclaimer, the term of this patent is extended or adjusted under 35 U.S.C. 154(b) by 748 days.

(21) Appl. No.: 14/398,562

(22) PCT Filed: May 3, 2013

(86) PCT No.: PCT/FR2013/050994
§ 371 (c)(1),
(2) Date: Nov. 3, 2014

(87) PCT Pub. No.: WO2013/167833
PCT Pub. Date: Nov. 14, 2013

(65) Prior Publication Data
US 2015/0106044 A1    Apr. 16, 2015

(30) Foreign Application Priority Data

May 11, 2012 (FR) ..................... 12 54330

(51) Int. Cl.
*G01R 31/36* (2006.01)

(52) U.S. Cl.
CPC ..... *G01R 31/3648* (2013.01); *G01R 31/3606* (2013.01); *G01R 31/3624* (2013.01); *G01R 31/3658* (2013.01)

(58) Field of Classification Search
None
See application file for complete search history.

(56) References Cited

U.S. PATENT DOCUMENTS

2011/0187378 A1    8/2011  Boehm et al.
2012/0310568 A1*  12/2012  Wang ................. G01R 31/3624
                                                                     702/63
(Continued)

FOREIGN PATENT DOCUMENTS

WO    2011 079977    7/2011

OTHER PUBLICATIONS

International Search Report dated Aug. 29, 2013 in PCT/FR13/050994 Filed May 3, 2013.
(Continued)

*Primary Examiner* — An Do
*Assistant Examiner* — Renee I Wilson
(74) *Attorney, Agent, or Firm* — Oblon, McClelland, Maier & Neustadt, L.L.P.

(57) ABSTRACT

A method for estimating a state of charge of a battery including plural cells connected in series, including: determination, at a given time, of a minimum cell voltage and of a maximum cell voltage from among the cell voltages, and calculation of a physical quantity analytically depending on the minimum and maximum cell voltages according to an equation including weighting elements ensuring the weight associated with the maximum cell voltage increases when the state of charge of the associated cell increases, and the weight associated with the minimum cell voltage increases when the state of charge of the associated cell decreases.

9 Claims, 3 Drawing Sheets

(56) References Cited

U.S. PATENT DOCUMENTS

2012/0330503 A1  12/2012  Boehm
2014/0203813 A1   2/2014  Driemeyer-Franco

OTHER PUBLICATIONS

French Search Report dated Feb. 28, 2013 in Priority Application No. FR 1254330 Filed May 11, 2012.

* cited by examiner

ESTIMATING OF THE STATE OF CHARGE OF A BATTERY

The present invention relates to a method and a device for estimating the state of charge of a battery comprising a plurality of electrochemical cells connected in series.

In the non-limiting field of electric and hybrid vehicles, one of the principal challenges of management systems for the drive batteries is the estimation of the state of charge, or SOC, of the battery. This information is displayed on the dashboard, in the form of a "battery gauge", and allows the driver to be made aware of the remaining mileage autonomy. Since the autonomy of an electric vehicle is much less than that of a thermal vehicle, it is important to reassure the driver by supplying him/her with the most reliable information possible. Estimation errors of the battery gauge may indeed cause the driver to find him/herself in unpleasant situations (broken down), or even dangerous situations (lack of power while overtaking).

Currently, as illustrated schematically in FIG. 1, the state of charge $SOC_{BAT}$ of a battery comprising N electrochemical cells $C_i$ connected in series is conventionally estimated based on measurements relating to the battery taken as an overall unit. Thus, a first device 1 measures the total voltage $U_{BAT}$ of the battery, taken across the terminals of the whole set of cells in series, and current and temperature sensors (not shown) respectively deliver the current $I_{BAT}$ flowing through the battery and the temperature $T_{BAT}$ of the battery. Using these three measurements, a software block 2 calculates an estimation of the state of charge $SOC_{BAT}$ using a conventional method such as an ampere-hour-metric method, or else a modeling of the Kalman filtering type. Such an estimation based on global measurements thus roughly corresponds to an average of the state of charge of the cells.

However, the electrochemical cells that constitute the battery have, by reason of their construction, characteristics that are different from one another in terms of dispersion of their capacity and of their internal resistance, and are furthermore subjected to different variations in temperature due to their location within the battery. As a consequence, these cells will necessarily have states of charge that are different from one another and the battery will be unbalanced. When this happens, the range of use of the battery is imposed by the cell with the most charge and by the cell with the least charge. In this case, the estimation based on overall measurements is false.

Other estimation devices envisioned include the estimation of the state of charge of each cell individually, so as to deduce from this a value of state of charge for the battery taking into account the imbalance in the cells. Such a device, shown schematically in FIG. 2, ideally comprises a first piece of equipment 1a simultaneously measuring the voltages $U_1$ to $U_N$ across the terminals of each cell $C_i$ composing the battery, a current sensor (not shown) respectively delivering the current $I_{BAT}$ flowing through the N cells of the battery and temperature sensors (not shown) supplying the temperature $T_i$ of each cell $C_i$ composing the battery. Using each measurement $U_i$, $T_i$ and $I_{BAT}$, N software blocks 2a calculate an estimation of the state of charge $SOC_i$ of each cell $C_i$, using a conventional method such as an ampere-hour-metric method, or else a modeling of the Kalman filtering type such as that described in the document U.S. Pat. No. 7,315,789. The state of charge $SOC_{BAT}$ of the battery is then estimated by a calculation module 2b based on the N states of charge $SOC_i$ delivered by the software blocks 2a. Although these devices are indeed more precise, they are also more costly and more complex from a software point of view. They require measurements of the voltage across the terminals of each of the cells composing the battery and sophisticated models for describing the behavior of each cell (notably a Kalman filter). In the case of a high-voltage battery, such as those used for electric vehicles, the large number of elementary cells (96 bi-cells in the current batteries) makes the cost of the device significant.

The aim of the present invention is to overcome the drawbacks of the prior art by providing, at a lower cost, a method for the precise estimation of the state of charge of a battery taking into account the imbalance in the cells.

For this purpose, the subject of the present invention is a method for estimating the state of charge of a battery comprising several electrochemical cells connected in series, the voltage across the terminals of the battery corresponding to the sum of the voltages across the terminals of each cell, called cell voltages, characterized in that it comprises:

a step for determining, at a given moment in time, the minimum cell voltage and the maximum cell voltage from amongst said cell voltages;
  a step for calculating a physical quantity on which the state of charge of the battery directly or indirectly depends, said physical quantity depending analytically, directly or indirectly, on said minimum cell voltage and on said maximum cell voltage according to an equation including weighting elements ensuring that the weighting associated with the maximum cell voltage increases when the state of charge of the associated cell increases, and the weighting associated with the minimum cell voltage increases when the state of charge of the associated cell decreases.

According to other possible characteristics of the invention:

said physical quantity is a weighted mean voltage depending analytically on said minimum cell voltage and on said maximum cell voltage according to the following equation:

$$U_{mp}(k) = \frac{V_{high\_threshold} U_{Cmin}(k) - V_{low\_threshold} U_{Cmax}(k)}{(V_{high\_threshold} - V_{low\_threshold}) - (U_{Cmax}(k) - U_{Cmin}(k))}$$

where $U_{Cmin}(k)$ and $U_{Cmax}(k)$ are respectively samples of the minimum cell voltage and the maximum cell voltage at the given moment in time k, $V_{low\_threshold}$ is a predetermined minimum voltage threshold in use corresponding to a minimum state of charge of the associated cell and $V_{high\_threshold}$ is a predetermined maximum voltage threshold in use corresponding to a maximum state of charge of the associated cell.

The estimation method may then furthermore comprise a step for estimating the state of charge of the battery using said mean voltage, a measurement of the current flowing through the cells at said moment in time, and a measurement of the temperature of the battery at said moment in time. The estimation step comprises for example a filtering of the Kalman type.

As a variant, the estimation method may furthermore comprise: a first estimation of the state of charge $SOC_{Cmin}(k)$ of the cell associated with the minimum cell voltage using said minimum cell voltage, a measurement of the current flowing through the cells at said moment in time, and a first measurement of temperature at said moment in time; and a second estimation of the state of charge $SOC_{Cmax}(k)$ of the cell associated with the maximum cell voltage using said maximum cell voltage, said measurement of current flowing through the cells at said moment in time, and a second measurement of temperature at said moment in time; said physical quantity being directly the state of charge of the battery at said moment in time, calculated according to the equation $$SOC_{BAT}(k) = \frac{SOC_{Cmin}(k)}{1 - (SOC_{Cmax}(k) - SOC_{Cmin}(k))}$$

The first and second estimations comprise a filtering of the Kalman type.

The first and second measurements of temperature are one and the same measurement representative of the temperature of the battery.

As a variant, the first and second measurements of temperature are two different measurements respectively taken in the neighborhood of the cell associated with the minimum cell voltage and in the neighborhood of the cell associated with the maximum cell voltage.

Another subject of the present invention is a device for estimating the state of charge of a battery comprising several electrochemical cells connected in series, the voltage across the terminals of the battery corresponding to the sum of the voltages across the terminals of each cell, called cell voltages, characterized in that it comprises:

a means for determining, at a given moment in time, the minimum cell voltage and the maximum cell voltage from amongst said cell voltages;

a means for calculating a physical quantity on which the state of charge of the battery directly or indirectly depends, said physical quantity depending analytically, directly or indirectly, on said minimum cell voltage and on said maximum cell voltage according to an equation including weighting elements ensuring that the weighting associated with the maximum cell voltage increases when the state of charge of the associated cell increases, and the weighting associated with the minimum cell voltage increases when the state of charge of the associated cell decreases.

The determination means is preferably an analog component performing a MIN-MAX function.

The invention and the advantages that it offers will be better understood by reading the following description presented with reference to the appended figures, in which.

Figure 3:
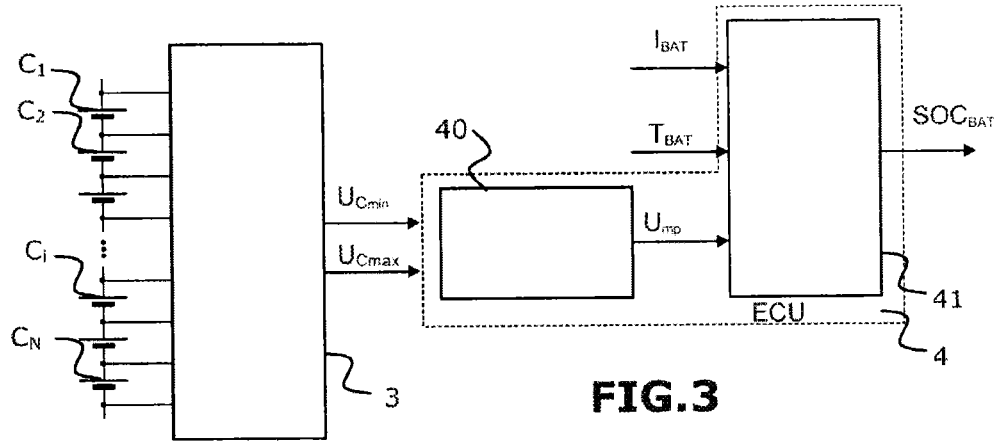
FIG. 3 illustrates schematically a first device implementing the method for estimating the state of charge of a battery according to the invention.
Figure 5:
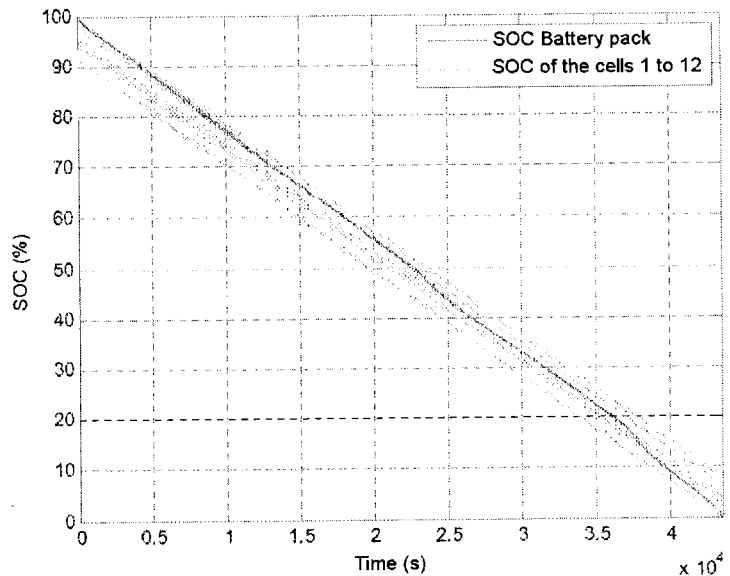
Figure 6:
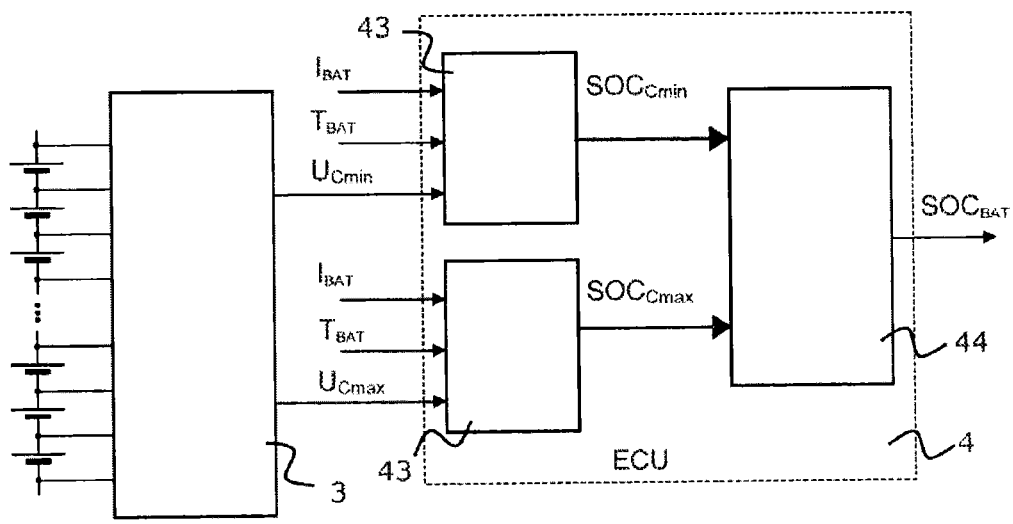
Figure 7:
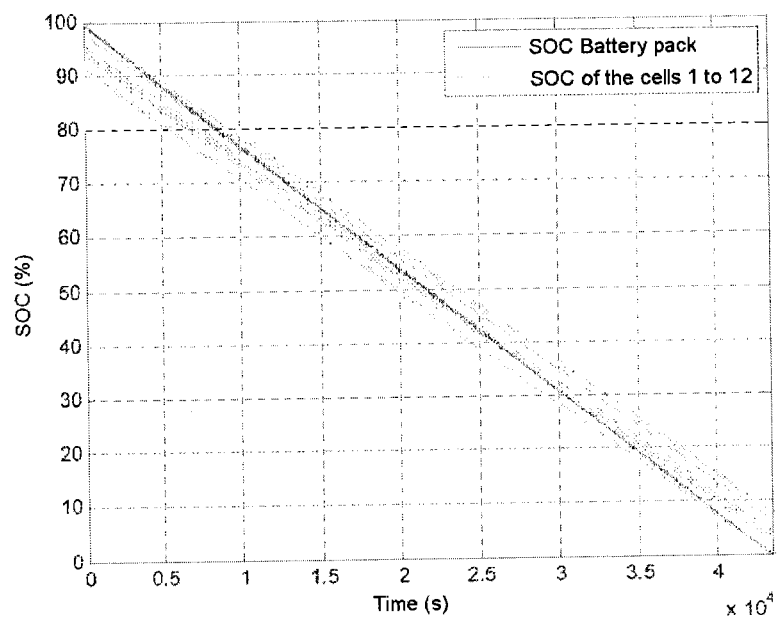

FIG. 5 presents one example of estimation of the state of charge of a battery obtained with the device in FIG. 3;

FIG. 6 illustrates schematically a second device implementing the method for estimating the state of charge of a battery according to the invention;

FIG. 7 presents one example of estimation of the state of charge of a battery obtained with the device in FIG. 6.

In the following part, a battery is considered that comprises N electrochemical cells $C_1$ to $C_N$ connected in series. In operation, the N cells thus have the same current $I_{BAT}$, and the voltage $U_{BAT}$ across the terminals of the battery corresponds, at each moment in time, to the sum of the N voltages $U_1$ to $U_N$ taken across the terminals of the N cells.

As was previously indicated, the solutions of the prior art base the estimation of the state of charge of such a battery either on a measurement of the overall voltage $U_{BAT}$ across the terminals of the whole assembly of cells, which renders the estimation very imprecise, or on N measurements corresponding to the N voltages $U_1$ to $U_N$ across the terminals of the N cells, referred to in the following as cell voltages, which has the advantage of increasing the precision of the estimation, but at the expense of a high processing power.

Figure 1:
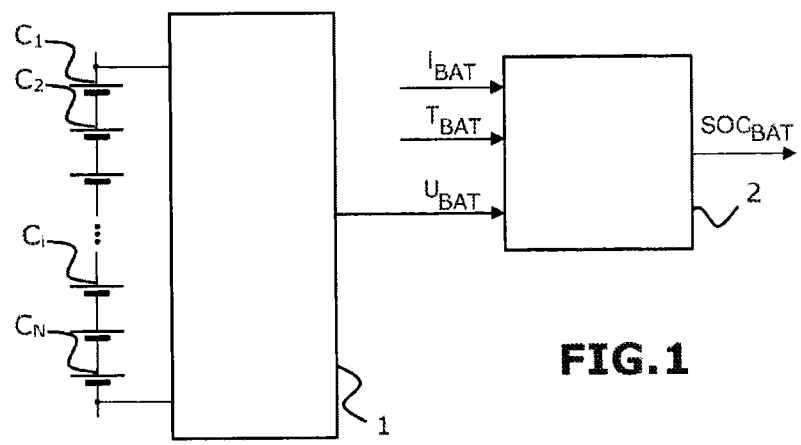
FIG. 1 illustrates schematically a device for estimating the state of charge of a battery based on measurements relating to the battery taken in its entirety, according to a known method.
Figure 2:
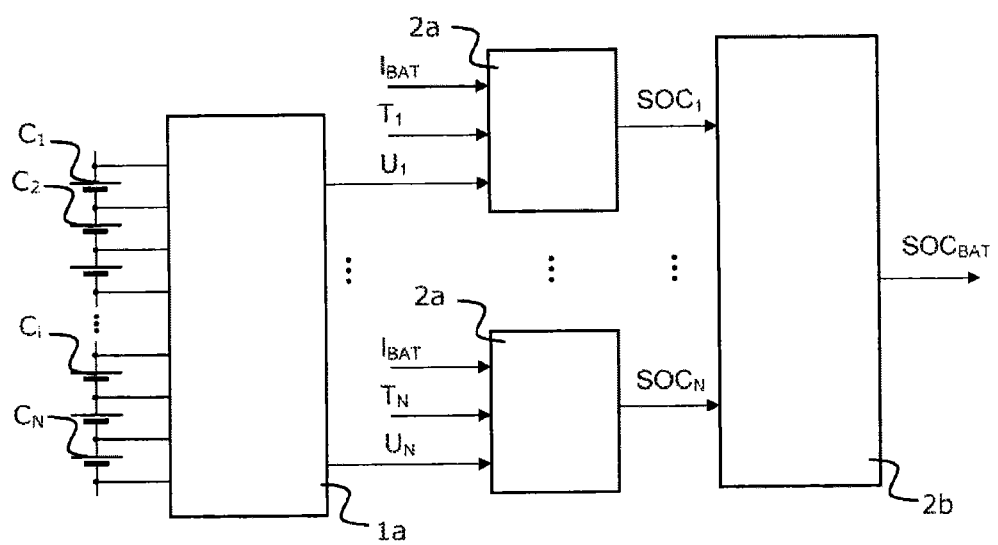
FIG. 2 shows schematically a device for estimating the state of charge of a battery based on measurements of voltages made on each cell composing the battery.

The studies undertaken in the framework of the present invention have allowed it to be demonstrated that an estimation at least as precise as that obtained with the device in FIG. 2 could be obtained by considering, rather than the whole set of the N cell voltages, only two particular values of these cell voltages at a given moment in time, one corresponding to the minimum value over the whole set of cell voltages, called minimum cell voltage, the other corresponding to the maximum value over the whole set of cell voltages, called maximum cell voltage, these two values being respectively denoted $U_{Cmin}$ and $U_{Cmax}$ in the following.

As will be explained in more detail in the following part of the description, it is indeed possible to define a physical quantity on which the state of charge $SOC_{BAT}$ of the battery directly or indirectly depends, this physical quantity itself depending analytically, directly or indirectly, on the minimum cell voltage $U_{Cmin}$ and on the maximum cell voltage $U_{Cmax}$ according to an equation including weighting elements ensuring that the weighting associated with the maximum cell voltage $U_{Cmax}$, increases when the state of charge of the associated cell increases, and the weighting associated with the minimum cell voltage $U_{Cmin}$ increases when the state of charge of the associated cell decreases.

More precisely, it must be ensured that the weighting associated with the maximum cell voltage $U_{Cmax}$ is maximum when this voltage $U_{Cmax}$ is in the neighborhood of a predetermined maximum threshold in use corresponding to a maximum state of charge (100%) of the associated cell, and the weighting associated with the minimum cell voltage $U_{Cmin}$ is maximum when this voltage $U_{Cmin}$ is in the neighborhood of a predetermined minimum threshold in use corresponding to a minimum state of charge (0%) of the associated cell. Between the two, the variation of the physical quantity must be continuous and without abrupt variations.

According to a first possibility, whose implementation will be described with reference to FIG. 3, the physical quantity in question is a weighted mean voltage $U_{mp}$ connected analytically to the minimum cell voltage $U_{Cmin}$ and to the maximum cell voltage $U_{Cmax}$ according to the equation:

$$U_{mp}(k) = \frac{V_{high\_threshold} U_{Cmin}(k) - V_{low\_threshold} U_{Cmax}(k)}{(V_{high\_threshold} - V_{low\_threshold}) - (U_{Cmax}(k) - U_{Cmin}(k))}$$

in which $U_{mp}(k)$, $U_{Cmin}(k)$ and $U_{Cmax}(k)$ are respectively samples of the weighted mean voltage, of the minimum cell voltage and of the maximum cell voltage at a given moment in time k, $V_{low\_threshold}$ is the minimum threshold in use (value of voltage for which the state of charge of a cell is 0%) and $V_{high\_threshold}$ is the maximum threshold in use (value of voltage for which the state of charge of a cell is 100%).

This equation may also be written in the following form, making the weighting elements $\alpha(k)$ and $(1-\alpha(k))$ indicated hereinbefore more apparent:

$$U_{mp}(k) = \alpha(k) \cdot U_{Cmin}(k) + (1 - \alpha(k)) \cdot U_{Cmax}(k) \quad (1)$$

$$\text{with } \alpha(k) = \frac{V_{high\_threshold} - U_{Cmax}(k)}{(V_{high\_threshold} - V_{low\_threshold}) - (U_{Cmax}(k) - U_{Cmin}(k))}$$

$$\text{and } (1 - \alpha(k)) = -\frac{V_{low\_threshold} - U_{Cmin}(k)}{(V_{high\_threshold} - V_{low\_threshold}) - (U_{Cmax}(k) - U_{Cmin}(k))}$$

As shown in FIG. 3, an estimation device according to the invention comprises a first module 3 connected to each terminal of the cells $C_1$ to $C_N$ composing the battery, capable of delivering the minimum $U_{Cmin}$ and maximum $U_{Cmax}$ cell voltages, preferably in the form of samples $U_{Cmin}(k)$ and $U_{Cmax}(k)$ at given moments in time k. The first module 3 is preferably a component capable of carrying out the MIN-MAX function, in other words of determining and delivering directly to an electronic control unit 4 of the device the two values $U_{Cmin}(k)$ and $U_{Cmax}(k)$, without it being necessary to measure the N cell voltages. A calculation module 40 in the electronic control unit 4 then calculates the weighted mean voltage $U_{mp}$ by applying the equation (1) hereinabove.

The device furthermore comprises a current sensor (not shown) capable of supplying a measurement $I_{BAT}$ of the current in the battery and a temperature sensor (not shown) capable of supplying a measurement $T_{BAT}$ of the temperature of the battery.

An estimation module 41 in the electronic control unit 4 receives, on the one hand, the weighted mean voltage $U_{mp}$ and, on the other, the measured current $I_{BAT}$ and temperature $T_{BAT}$, and calculates an estimation of the state of charge $SOC_{BAT}$ of the battery using these three values.

Figure 4:
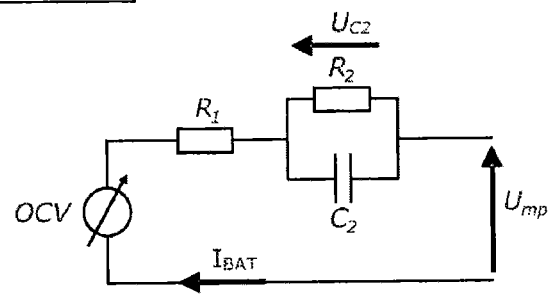
FIG. 4 shows a modeling of the electrical behavior of a battery.

Although other algorithms may be used, the estimation module 41 preferably implements a filtering method of the Kalman type, which will now be explained:

The electrical behavior of the battery is described by a model of the "equivalent electrical circuit" type, shown in FIG. 4. Here, the battery is represented as one cell, whose weighted mean voltage $U_{mp}$ is the closed-circuit voltage, and where: OCV is the unloaded voltage, $I_{BAT}$ is the current flowing through the battery, $R_1$ corresponds to the average internal resistance of a cell, $R_2$ and $C_2$ are a resistance and a capacitance (average for one cell) used for modeling dynamic phenomena and $U_{C2}$ is the voltage of the $R_2 \| C_2$ pair. The unloaded voltage OCV is a non-linear function of the state of charge, and is different for each battery chemistry. It is possible to perform a segmented affine approximation of this curve, in other words an approximation of the type $OCV(\theta) = a\theta + b$, which is used in the following.

Furthermore, the variation of the state of charge of the battery between two successive samples separated by the sampling period $T_e$ is given by the expression:

$$SOC_{BAT}(k) = SOC_{BAT}(k-1) + \frac{T_e}{Q_{max}} I_{BAT}(k-1)$$

where $Q_{max}$ is the capacity in Ah (Ampere-hour) of the battery.

By combining the model of the electrical behavior with the variation of the state of charge of the battery, the mathematical model is obtained given by the system of equations:

$$\begin{cases} x(k+1) = A_s x(k) + B_s u(k) \\ y(k) = C_s x(k) + D_s u(k) \end{cases}$$

with
a state vector $$x(k) = \begin{bmatrix} SOC_{BAT}(k) \\ U_{C2}(k) \end{bmatrix},$$

an output vector $y(k) = U_{mp}(k) - b$,
a control vector $u(k) = I_{BAT}(k)$ and
matrices $$A_s = \begin{bmatrix} 1 & 0 \\ 0 & \left(1 - \frac{T_e}{R_2 C_2}\right) \end{bmatrix}, B_s = \begin{bmatrix} \frac{T_e}{Q_{max}} \\ \frac{T_e}{C_2} \end{bmatrix}, C_s = [a \quad 1], D_s = R_1$$

It should be noted that the matrices for transition $A_s$, control $B_s$ and link between control and output $D_s$ are updated at each calculation step, since they depend on the parameters $R_1$, $R_2$ and $C_2$, which themselves vary as a function of the temperature, of the state of charge (and potentially, of the state of health SOH).

The Kalman filtering then conventionally consists in:
(a) Predicting the state and the output using the following equations:

$$\hat{x}_{k|k-1} = A_s \hat{x}_{k-1|k-1} + B_s u_{k-1}$$

$$\hat{y}_{k|k-1} = C_s \hat{x}_{k-1|k-1} + D_s u_{k-1}$$

(b) Calculating the optimum gain $K_k$ of the filter:

$$K_k = P_{k|k-1} C_s^T (C_s P_{k|k-1} C_s^T + R_{kal})^{-1}$$

with $P_{k|k-1} = A_s P_{k-1|k-1} A_s^T + Q_{kal}$ $$P_{k|k} = P_{k|k-1} - K_k (C_s P_{k|k-1} C_s^T + R_{kal}) K_k^T$$

where $Q_{kal}$ and $R_{kal}$ respectively correspond to the variance of the state and to the variance of the output.

(c) Correcting the state predicted by re-injecting the error into the estimated output:

$$\hat{x}_{k|k} = \hat{x}_{k|k-1} + K_k (y_k - \hat{y}_{k|k-1})$$

The state of charge of the battery is given by the result of the estimator, according to the relationship $$SOC_{BAT}(k) = [1 \quad 0] \hat{x}_{k|k}$$

One example of the results obtained by applying the preceding estimator for one driving cycle is shown in FIG. 5. For this test, a battery composed of 12 cells, with a dispersion of +/−5% on the states of charge of the cells, has been used. The figure illustrates with a bold line the time variation of the estimated state of charge of the battery and, with lighter lines, the variations of the states of charge of the various cells. In this FIG. 5, it is observed that the time variation of the state of charge of the battery is in accordance with expectations. Indeed, the state of charge of the battery is at 100% when the cell with the most charge also exhibits a state of charge of 100%, and the state of charge of the battery is at 0% when the cell with the least charge also exhibits a state of charge of 0%. Between these two values, the state of charge decreases in a continuous manner, without any abrupt variations.

FIG. 6 illustrates schematically a second device according to the present invention. Here, the physical quantity of interest is directly the state of charge of the battery $SOC_{BAT}$. As in the case shown in FIG. 3, the device comprises a first module 3 connected to each terminal of the cells $C_1$ to $C_N$ composing the battery, capable of delivering the minimum $U_{Cmin}$ and maximum $U_{Cmax}$ cell voltages, preferably in the form of samples $U_{Cmin}(k)$ and $U_{Cmax}(k)$ at given moments in time k. Here again, this first module 3 is preferably a component capable of carrying out the MIN-MAX function, in other words of determining and delivering directly to an electronic control unit 4 of the device the two values $U_{Cmin}(k)$ and $U_{Cmax}(k)$ without it being necessary to measure the N cell voltages.

The device furthermore comprises a current sensor (not shown) capable of supplying a measurement $I_{BAT}$ of the current of the battery and a temperature sensor (not shown) capable of supplying a measurement $T_{BAT}$ of the temperature of the battery.

In contrast to the device in FIG. 3, the electronic control unit 4 here comprises two estimation modules 43:

a first module connected to that of the two outputs of the first module 3 delivering the minimum cell voltage $U_{Cmin}$, this first module being capable of delivering an estimation $SOC_{Cmin}$ of the state of charge of the cell with the least charge using the values $U_{Cmin}$, $I_{BAT}$ and $T_{BAT}$.

A second module connected to that of the two outputs of the first module 3 delivering the maximum cell voltage $U_{Cmax}$, this second module being capable of delivering an estimation $SOC_{Cmax}$ of the state of charge of the cell with the most charge starting from the values $U_{Cmax}$, $I_{BAT}$ and $T_{BAT}$.

The two estimation modules 43 deliver, at each sampling time k, two samples $SOC_{Cmin}(k)$ and $SOC_{Cmax}(k)$, estimated by any known method, such as the filtering method of the Kalman type explained hereinbefore.

A calculation module 44 of the electronic control unit 4 then calculates the state of charge $SOC_{BAT}(k)$ of the battery, by weighting the states of charge of the two cells with the most and with the least charge according to the equation:

$$SOC_{BAT}(k) = \frac{SOC_{high\_threshold}SOC_{Cmin}(k) - SOC_{low\_threshold}SOC_{Cmax}(k)}{(SOC_{high\_threshold} - SOC_{low\_threshold}) - (SOC_{Cmax}(k) - SOC_{Cmin}(k))}$$

in which $SOC_{high\_threshold}$ is the state of charge equal to 1 of a cell whose cell voltage corresponds to the maximum threshold in use defined previously, and $SOC_{low\_threshold}$ is the state of charge equal to 0 of a cell whose cell voltage corresponds to the minimum threshold in use defined previously.

In other words:

$$SOC_{BAT}(k) = \delta(k))SOC_{Cmin}(k) + (1 - \delta(k))SOC_{Cmax}(k)$$

with $\delta(k) = \dfrac{SOC_{high\_threshold} - SOC_{Cmax}(k)}{(SOC_{high\_threshold} - SOC_{low\_threshold}) - (SOC_{Cmax}(k) - SOC_{Cmin}(k))}$ and $(1 - \delta(k)) = -\dfrac{SOC_{low\_threshold} - SOC_{Cmin}(k)}{(SOC_{high\_threshold} - SOC_{low\_threshold}) - (SOC_{Cmax}(k) - SOC_{Cmin}(k))}$ As $SOC_{high\_threshold}=1$ and $SOC_{low\_threshold}=0$ this leads to the following simplified formula:

$$SOC_{BAT}(k) = \frac{SOC_{Cmin}(k)}{1 - (SOC_{Cmax}(k) - SOC_{Cmin}(k))}$$

One example of the results obtained by applying the preceding estimator for one driving cycle is shown in FIG. 7. For this test, a battery composed of 12 cells, with a dispersion of +/−5% on the states of charge of the cells, has been used. The figure illustrates with a bold line the time variation of the estimated state of charge of the battery, and using lighter lines, the variations of the states of charge of the various cells. It is observed here again that the time variation of the state of charge of the battery is as expected, with a state of charge of the battery of 100% when the cell with the most charge also has a state of charge of 100%, a state of charge of the battery of 0% when the cell with the least charge also has a state of charge of 0%, and a continuous decrease, without abrupt variations, of the state of charge between these two extreme values.

The device according to FIG. 6 requires a processing power that is slightly higher than that needed for the device in FIG. 3, but offers the advantage of being insensitive to the non-linear behavior of the unloaded voltage of the battery.

The estimation of the device according to FIG. 6 may be further refined in the case where the first module 3 is capable of identifying the two cells which have the values $U_{Cmin}$ and $U_{Cmax}$. A better estimation of the values $SOC_{Cmin}$ and $SOC_{Cmax}$ may then be made by the modules 43 by taking into account the temperature in the neighborhood of the two cells identified, and by using the parameters specific to these cells (notably their capacity Qmax and their state of health SOH).

In all the cases presented hereinabove, the estimation devices according to the invention have a precision comparable with that illustrated in FIG. 2, while nevertheless requiring less processing power. Furthermore, the total cost of the device may be even more reduced if the module 3 used is capable of delivering the measurements $U_{Cmin}$ and $U_{Cmax}$ directly without it being necessary to measure all of the cell voltages.

The invention claimed is:

1. A method for estimating a state of charge of a battery in an electric or hybrid vehicle, the battery including plural electrochemical cells connected in series, a voltage across terminals of the battery corresponding to a sum of cell voltages across terminals of each electrochemical cell, the method comprising:

determining, using processing circuitry, at a given moment in time, a minimum cell voltage and a maximum cell voltage from amongst the cell voltages across the terminals of the electrochemical cells connected in series without measuring all of the cell voltages of the plural electrochemical cells at the given moment in time;

determining, using the processing circuitry, a physical quantity on which the state of charge of the battery directly or indirectly depends, the physical quantity depending analytically, directly or indirectly, on the determined minimum cell voltage and on the determined maximum cell voltage according to an equation that includes weighting elements ensuring that a weighting associated with the determined maximum cell voltage increases when a state of charge of an associated electrochemical cell increases, and a weighting associated with the determined minimum cell voltage increases when the state of charge of the associated electrochemical cell decreases; and estimating, using the processing circuitry, the state of charge of the battery from the determined physical quantity to measure current flowing through the electrochemical cells at the given moment in time, and to measure temperature of the battery at the moment in time.

2. The estimation method as claimed in claim 1, wherein the physical quantity is a weighted mean voltage depending analytically on the minimum cell voltage ($U_{Cmin}$) and on the maximum cell voltage ($U_{Cmax}$) according to equation:

$$U_{mp}(k) = \frac{V_{high\_threshold} U_{Cmin}(k) - V_{low\_threshold} U_{Cmax}(k)}{(V_{high\_threshold} - V_{low\_threshold}) - (U_{Cmax}(k) - U_{Cmin}(k))},$$

in which $U_{Cmin}(k)$ and $U_{Cmax}(k)$ are respectively samples of the determined minimum cell voltage and the determined maximum cell voltage at the given moment in time k, $V_{low\_threshold}$ is a predetermined minimum voltage threshold in use corresponding to a minimum state of charge of the associated electrochemical cell and $V_{high\_threshold}$ is a predetermined maximum voltage threshold in use corresponding to a maximum state of charge of the associated electrochemical cell.

3. The estimation method as claimed in claim 1, wherein said estimating comprises filtering using a Kalman filter.

4. The estimation method as claimed in claim 1, further comprising:

a first estimation of the state of charge $SOC_{Cmin}(k)$ of the electrochemical cell associated with the determined minimum cell voltage using the minimum cell voltage, a measurement of current flowing through the electrochemical cells at the given moment in time, and a first measurement of temperature at the given moment in time; and a second estimation of the state of charge $SOC_{Cmax}(k)$ of the electrochemical cell associated with the determined maximum cell voltage using the maximum cell voltage, the measurement of current flowing through the electrochemical cells at the given moment in time, and a second measurement of temperature at the given moment in time, wherein the physical quantity is directly the state of charge ($SOC_{BAT}$) of the battery at the given moment in time, is calculated according to equation $$SOC_{BAT}(k) = \frac{SOC_{Cmin}(k)}{1 - (SOC_{Cmax}(k) - SOC_{Cmin}(k))}.$$

5. The estimation method as claimed in claim 4, wherein the first and second estimations implement Kalman filtering.

6. The estimation method as claimed in claim 4, wherein the first and second measurements of temperature are one and a same measurement representative of the temperature of the battery.

7. The estimation method as claimed in claim 4, wherein the first and second measurements of temperature are two different measurements respectively taken in association with the electrochemical cell associated with the determined minimum cell voltage and in in association with the electrochemical cell associated with the determined maximum cell voltage.

8. A device for estimating a state of charge of a battery in an electric or hybrid vehicle, the battery comprising plural electrochemical cells connected in series, a voltage across terminals of the battery corresponding to sum of cell voltages across terminals of each electrochemical cell, the device comprising:

circuitry configured to determine, at a given moment in time, a minimum cell voltage and a maximum cell voltage from amongst the cell voltages across the terminals of the electrochemical cells connected in series without measuring all of the cell voltages of the plural electrochemical cells at the given moment in time, calculate a physical quantity on which the state of charge of the battery directly or indirectly depends, the physical quantity depending analytically, directly or indirectly, on the determined minimum cell voltage and on the determined maximum cell voltage according to an equation that includes weighting elements ensuring that a weighting associated with the determined maximum cell voltage increases when a state of charge of an associated electrochemical cell increases, and a weighting associated with the determined minimum cell voltage increases when the state of charge of the associated electrochemical cell decreases, and estimate the state of charge of the battery from the calculated physical quantity to measure current flowing through the electrochemical cells at the given moment in time, and to measure temperature of the battery at the moment in time.

9. The estimation device as claimed in claim 8, wherein the circuitry includes an analog component configured to perform a MIN-MAX function to determine, at the given moment in time, the minimum cell voltage and the maximum cell voltage without measuring all of the cell voltages of the plural electrochemical cells at the given moment in time.

* * * * *